United States Patent [19]

Ecklund

[11] Patent Number: 4,712,241
[45] Date of Patent: Dec. 8, 1987

[54] BROADCAST SIGNAL DETECTED INDICATION SYSTEM

[75] Inventor: Lawrence M. Ecklund, Wheaton, Ill.

[73] Assignee: Motorola, Inc., Schaumburg, Ill.

[21] Appl. No.: 902,860

[22] Filed: Sep. 2, 1986

[51] Int. Cl.$^4$ ............................................. H04H 5/00
[52] U.S. Cl. ..................................... 381/15; 381/12;
455/166
[58] Field of Search .............. 455/161, 166, 212, 222;
381/12, 15, 13; 329/50, 124

[56] References Cited

U.S. PATENT DOCUMENTS

| | | | |
|---|---|---|---|
| 3,582,794 | 6/1971 | Smith | 381/12 |
| 4,504,966 | 3/1985 | Hershberger | 381/15 |
| 4,606,075 | 8/1986 | Eastmond | 455/161 |

Primary Examiner—Forester W. Isen
Attorney, Agent, or Firm—Steven G. Parmelee

[57] ABSTRACT

In a radio having an in phase multiplier (A) for providing an in phase detected signal, a detection unit for receiving this signal and for determining whether this signal includes any negative polarity components which would indicate that a viable broadcast signal does not exist on the incoming frequency of interest. This detection unit can include a comparator (11) for comparing the incoming signal against a selected reference value. The invention can also include a signal quality evaluation unit (58) for providing either a digital or analog quality signal that can also effect the output and be used by appropriate processing circuitry to further refine the channel selection process.

10 Claims, 6 Drawing Figures

BROADCAST SIGNAL DETECTED INDICATION SYSTEM

TECHNICAL FIELD

This invention relates generally to devices that can detect when a radio receiver has locked on to a viable broadcast station and particularly to such devices as are used in AM stereo radio receivers.

BACKGROUND ART

Many radio receivers are capable of receiving broadcast signals at a plurality of different selectable frequencies. The radio will ordinarily demodulate the signal in order to extract the information it carries and make it audible to the operator of the radio. In most commercial broadcast spectrums, the frequency at which such signals may be broadcast are ordinarily specified by a government agency. For example, in the AM broadcast spectrum in North America, stations can only broadcast on frequencies located at 10 kHz increments.

This does not mean, however, that a viable broadcast signal can be found at every 10 kHz increment in the AM range in every broadcast area. Instead, some of these channels will ordinarily remain unassigned in certain areas, and such unassigned channels will generally be void of useful transmissions.

Many radio receivers include a channel scanning mechanism that, when activated by the operator, will cause a station tuning mechanism to increment in frequency until a broadcast station can be located. Since all possible broadcast frequencies may not be used in a given area, such a channel scanning mechanism cannot simply stop at each potentially assigned frequency. Further, such a mechanism cannot simply monitor for energy at potentially assigned frequencies because nonuseful transmissions, such as noise, may be present and be falsely interpreted as a viable broadcast signal.

Figure 1:
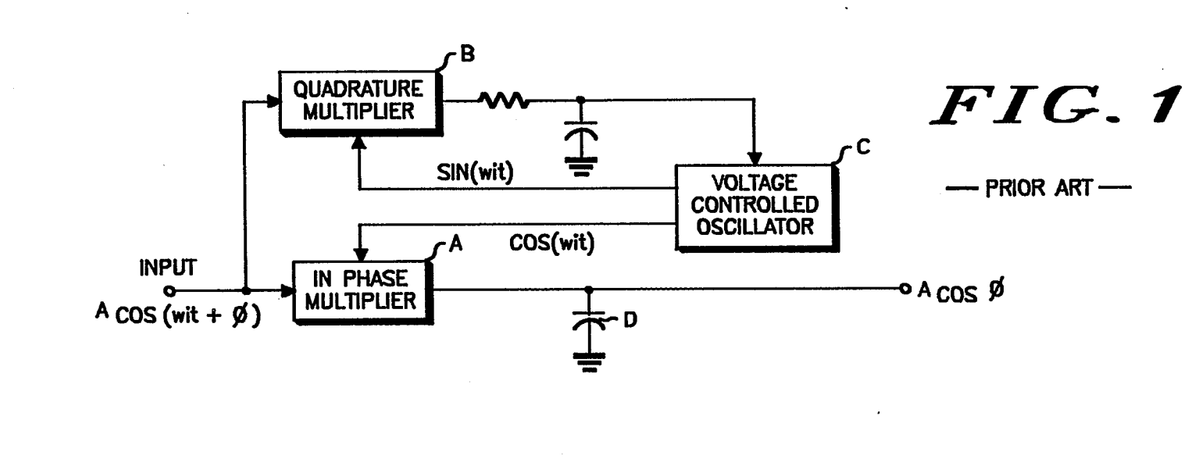
FIG. 1 comprises a block diagram depiction of a prior art approach.

One prior art solution having particular relevance in an AM stereo radio receiver can be seen in FIG. 1. Many AM stereo receivers include an in phase multiplier (A) and a quadrature multiplier (B) that both receive an intermediate frequency signal defined as $A\cos(Wit+\phi)$ (where "A" constitutes an amplitude factor, "wi" comprises the frequency of the IF section, and "$\phi$" includes pertinent stereo information). The output of the quadrature multiplier (B) drives a voltage controlled oscillator (C) that, when locked with respect to the incoming signal, provides two outputs. The first output comprises $\sin(Wit)$ as supplied to the quadrature multiplier (B) and the second output comprises $\cos(Wit)$ as supplied to the in phase multiplier (A). The in phase multiplier (A) multiplies the incoming signal by the VCO (C) output to provide an $A\cos\phi$ output signal.

When a broadcast station has been locked on to as described above, this output signal from the in phase multiplier (A) will generally include only positive polarity components. Therefore, by providing a capacitor (D) to integrate this signal over time and thereby obtain an average, the output of the in phase multiplier (A) can be monitored to determine whether a broadcast station has indeed been tuned.

Unfortunately, however, the above described prior art approach does not provide a completely adequate solution in all settings.

This prior art approach indicates only the presence or absence of a broadcast signal, and provides no indication regarding the potential quality of the received signal. Therefore, this approach might cause a channel scanning mechanism to stop on an unacceptably noisy station or on a distant station that may drift in and out of audible range and therefore prove an unsatisfying selection.

There therefore exists a need for a broadcast signal detected indication system that can provide some measure of signal quality.

SUMMARY OF THE INVENTION

The above needs and others are substantially met through provision of the broadcast signal detected indication system described in this specification. This invention operates in conjunction with a radio, such as an AM stereo receiver, that includes a signal processing unit such as an in phase multiplier for processing intermediate frequency signals. When locked on to a viable broadcast signal, the output signal from such an in phase multiplier will typically include only positive polarity signals; i.e., the waveform of the in phase detector output consistently remains above zero volts. When not locked onto a viable broadcast signal, however, the output of the in phase multiplier will typically include both positive and negative polarity components.

The invention includes a detection unit that receives the output of the in phase multiplier and compares it against a predetermined threshold. In particular, the detection unit functions to determine when the in phase multiplier output includes a negative polarity component of sufficient magnitude to justify a conclusion that a viable broadcast signal is not present. In response to sensing such indicia, the detection unit provides a trigger signal that can be used by a channel scanning mechanism to enable the scanning function.

In one embodiment of this invention, the detection unit may include a pulse generator for responding to detection of a negative polarity component by providing a pulse. This embodiment may further include a latch for effectively stretching the pulse width prior to providing the signal to a drive unit and the trigger output. Through use of this embodiment, a detected indicia of a nonviable signal will ensure an appropriate output for at least a minimum predetermined period of time.

In another embodiment of this invention, the detection unit may include a switch that can be controlled by the trigger signal referred to above. In addition, a signal quality evaluation unit can be provided, presuming that the radio receiver also includes an automatic gain control amplifier and an envelope detector, which envelope detector provides a gain control feedback signal to the AGC amplifier to control its operation. The signal quality evaluation unit receives the gain control feedback signal and monitors this signal to determine when and if the incoming signal is too weak for the AGC amplifier to appropriately respond to it. When this occurs, the signal quality evaluation unit has an appropriate control mechanism for allowing it to trigger the switch regardless of whether the detection unit detects the presence of negative plurality signal components.

Through use of this embodiment, a signal need not be selected by the channel scanning mechanism if the strength of the signal will not ensure adequate receiver operation.

In yet another embodiment, the signal quality evaluation unit can be configured to provide an analog output signal, the value of which provides a proportional indication of the strength of the incoming signal as determined by the value of the gain control feedback signal to the AGC amplifier. This analog quality signal can be utilized as desired by radio receiver designers to customize the channel scanning mechanism to match the sensitivity of their radios, thereby assuring optimum performance of the channel scanning function.

In yet another embodiment, the signal detection function of the invention as described above can be ANDed with a stereo broadcast pilot tone as detected by a pilot tone detector. The resultant signal can be used to control the channel scanning mechanism to seek only stereo broadcasts that exhibit the desirable characteristics.

All of the above embodiments include the common function of analyzing the output of a signal processing unit, which output will include unipolarity components only when locked on to a viable broadcast station. In the examples given, the signal processing unit can be realized through use of an in phase multiplier. The output of the in phase multiplier can be monitored for the presence of a negative plurality component of sufficient magnitude to justify a conclusion that a nonviable broadcast signal is then currently being received by the radio. This conclusion justifies provision of a trigger signal that can be utilized by a channel scanning mechanism of choice to cause the channel scanning mechanism to move to the next potentially assigned broadcast channel. In general, this device will, allow a station quality measurement to be made without significantly affecting scan time.

BRIEF DESCRIPTION OF THE DRAWINGS

These and other attributes of the invention will become more clear upon making a thorough review and study of the following detailed description of the best mode for carrying out the invention, particularly when reviewed in conjunction with the drawings, wherein.

BEST MODE FOR CARRYING OUT THE INVENTION

Figure 2:
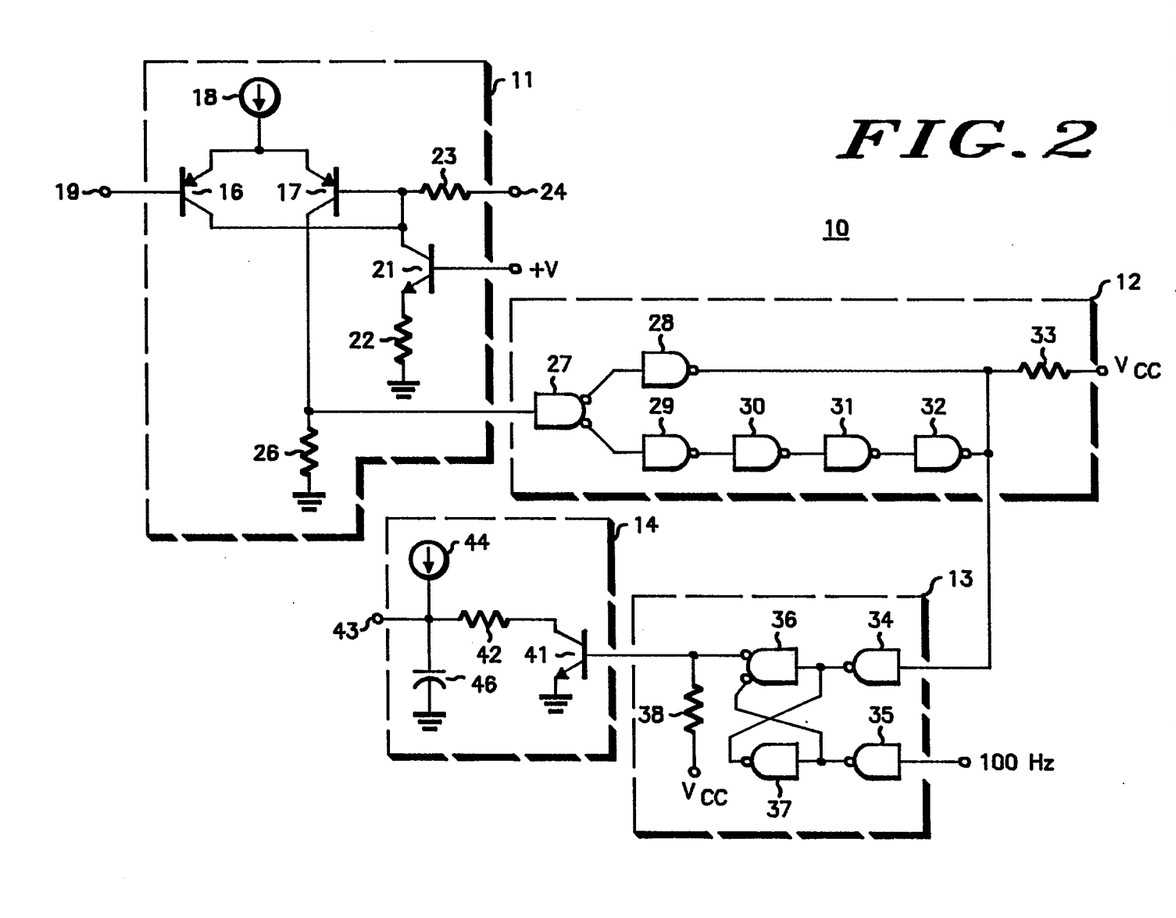
FIG. 2 comprises a schematic representation of one embodiment of the invention.

Referring now to the drawings, and in particular to FIG. 2, a first embodiment of the invention can be seen as depicted generally by the numeral 10. This embodiment includes generally a detection unit that includes a comparator stage (11), a pulse generator (12), a latch (13), and a driver output stage (14). Each of the above generally referred to components will now be described in more detail in seriatim fashion.

The comparator (11) can be comprised of a differential amplifier formed of two transistors (16 and 17). The emitters of both transistors (16 and 17) connect to an appropriate current source (18) as well understood in the art. The base of the first transistor (16) connects to the output of an in phase multiplier (A) (FIG. 1) as denoted by the reference numeral 19. The base of the second transistor (17) connects to the collector of the first transistor (16), and to the collector of a third transistor (21), these three components comprising part of a Schmitt trigger. This third transistor (21) has a base that connects to a positive voltage source, an emitter that connects to a grounded 12k ohm resistor (22), and a collector that connects through a 3.9k ohm resistor (23) to a voltage reference (24). The collector of the second transistor (17) comprises the output of the comparator (11) and connects to a grounded 27k ohm resistor (26) and to the pulse generator (12).

So configured, the incoming in phase multiplier output signal will be compared against a negatively offset reference signal, and any difference between the two will be provided to the pulse generator (12) such that any negative polarity components in the in phase detector output signal that exceed (negatively) the reference signal will provide an enabling signal to the pulse generator (12).

The pulse generator (12) includes six $I^2L$ logic gates (27-32). The first gate (27) receives the output of the comparator (11) and through one output connects to the input of the second gate (28) and through another output connects to the input of a third gate (29). The third gate (29) connects in series with the remaining three gates (30-32). The output of the second gate (28) and the sixth gate (32) connect in common to form the output of the pulse generator (12). This output connects to a biased 82k ohm resistor (33) and to the latch (13).

So configured, an enabling pulse from the comparator (11) will trigger the pulse generator to provide a pulse of desired form to the latch (13).

The latch (13) includes four $I^2L$ logic gates (34-37). The first gate (34) has its input connected to the output of the pulse generator (12) and the second gate (35) has its input connected to receive a pilot clock signal of approximately 100 Hz. The output of the first gate (34) connects to the input of the third gate (37) and to the output of the fourth gate (37). The output of the second gate (35) connects to the input of the fourth gate (37) and to an output of the third gate (36). A second output of the third gate (36) connects to a biasing resistor (38) to form an output that connects to the driver output stage (14).

So configured, the latch (13), upon receiving a pulse from the pulse generator (12), will provide an output pulse to the driver output stage (14) having at least a minimum duration as governed by the pilot clock input.

The driver output stage (14) includes a drive transistor (41) having a base that connects to the output of the latch (13), an emitter that connects to ground, and a collector that connects through a 10 k ohm resistor (42) to form a trigger output (43). A five microampere pull-up source (44) may be connected to the trigger output (43), as may a grounded capacitor (46).

So configured, the driver output unit (14) will provide a positive output signal so long as the output of the in phase multiplier (A) (FIG. 1) does not include any negative polarity components. Upon detecting such a negative polarity component through the comparator (11), however, the output will immediately drop low, thereby providing a trigger signal that can be utilized by any appropriate channel scanning mechanism to enable the scanning function.

Figure 3:
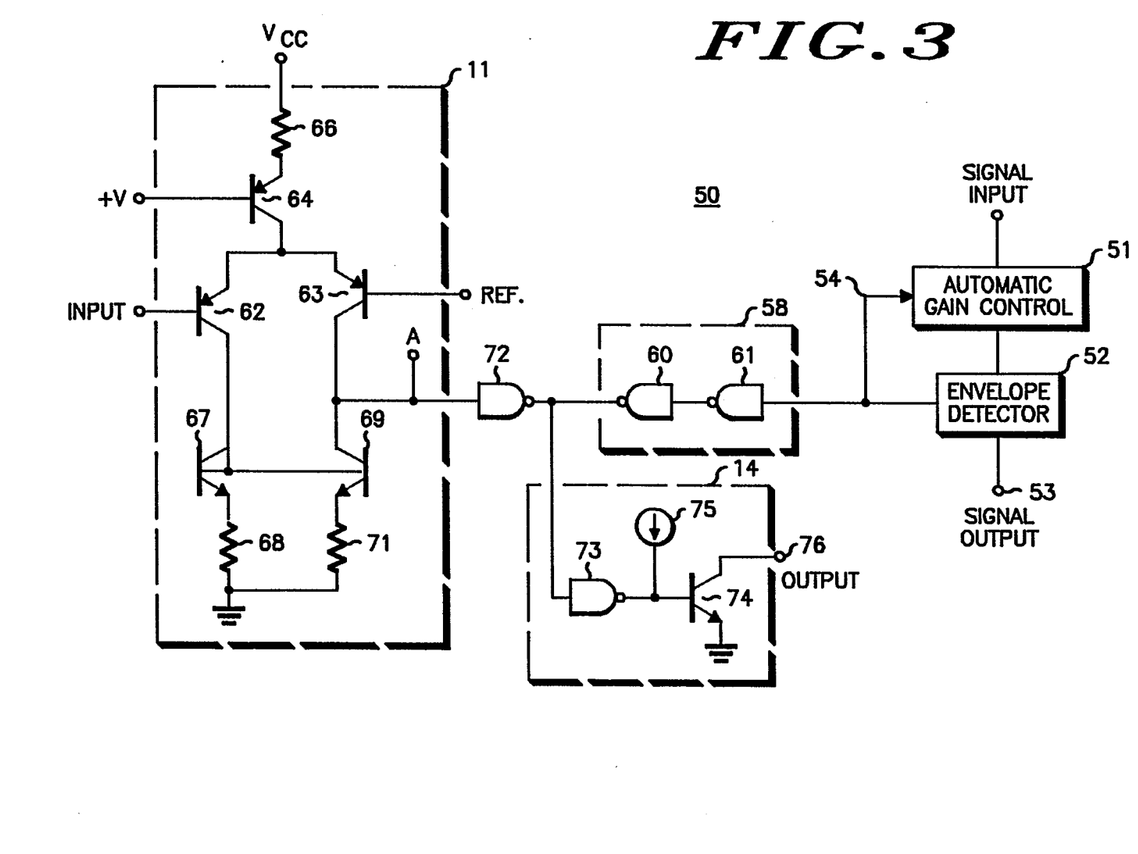
FIG. 3 comprises a schematic diagram of a second embodiment of the invention.

Referring now to FIG. 3, a second embodiment of the invention can be seen as depicted generally by the numeral 50. This embodiment (50) presumes that the radio receiver also has an automatic gain control amplifier (51) for providing appropriate amplifier control of the signal being processed. Such an AGC (51) typically receives a gain control feedback signal from some appropriate source. In this particular embodiment, it will be presumed that the output of the AGC (51) passes to an envelope detector (52). The envelope detector (52), in addition to providing a detected envelope output (53), provides a gain control feedback signal (54) to control the gain of the AGC (51).

This embodiment (50), in addition to including a comparator (11) and a driver output unit (14), further includes a signal quality evaluation unit (58). When a weak signal is provided at the input of the AGC (51), the gain control feedback signal (54) will be low. The signal quality evaluation unit (58), which in this embodiment is comprised of two I²L logic gates (60 and 61), will pass this low signal on to cause the driver output unit (14) to provide a trigger signal regardless of the functioning of the comparator (11) as described in more detail below.

In this embodiment (50), the comparator (11) includes a differential amplifier comprised of two transistors (62 and 63). The first transistor (62) has its base connected to receive the output of the in phase multiplier (A) (FIG. 1). The base of the second transistor (63) connects to receive a reference signal. The emitters for both transistors (62 and 63) connect to a current source comprised of a third transistor (64), the base of which connects to a positive voltage source and the emitter of which connects through a resistor (66) to $V_{CC}$.

The collector of the first transistor (62) connects to the collector of a diode configured transistor (67), the base of which connects to the base of a fourth transistor (69) and the emitter of which connects to ground through a resistor (68). The collector of the second transistor (63) connects to the collector of the fourth transistor (69), which has an emitter connected to a grounded resistor (71). In addition, the collector of the second transistor (63) connects to the input of an I²L logic gate (72), the input of which has no pull-up current.

The driver output unit (14) includes one I²L gate (73), a driver transistor (74), and a 5 microamp current source (75). The input of the I²L gate (73) connects to the output of the gate (72) referred to above, and the output thereof connects to the current source (75) and to the base of the transistor (74). The emitter of this transistor (74) connects to ground and the collector comprises the output (76) of the detection unit.

As configured, and by choosing appropriate values for the comparator resistors (68 and 71), the comparator (11) will provide an enabling signal at its output when the in phase multiplier output signal has a negative polarity component in excess of 10% of the maximum positive polarity value. Such a signal will result in biasing on the driver output transistor (74) to provide a low signal at the output (76) that constitutes the trigger signal that indicates that a viable broadcast signal has not been detected.

Presuming that no sufficiently negative polarity components are detected by the comparator (11), the driver control output (14) can also be triggered by the signal quality evaluation unit (58), should the incoming signal be so weak as to be outside the effective range of the AGC (51). Therefore, by use of this embodiment (50), a channel scanning mechanism can be made sensitive to either indicia that a viable broadcast signal does not exist on the currently investigated frequency, or to detection of a signal that is too weak to be suitably processed by the radio.

Figure 4:
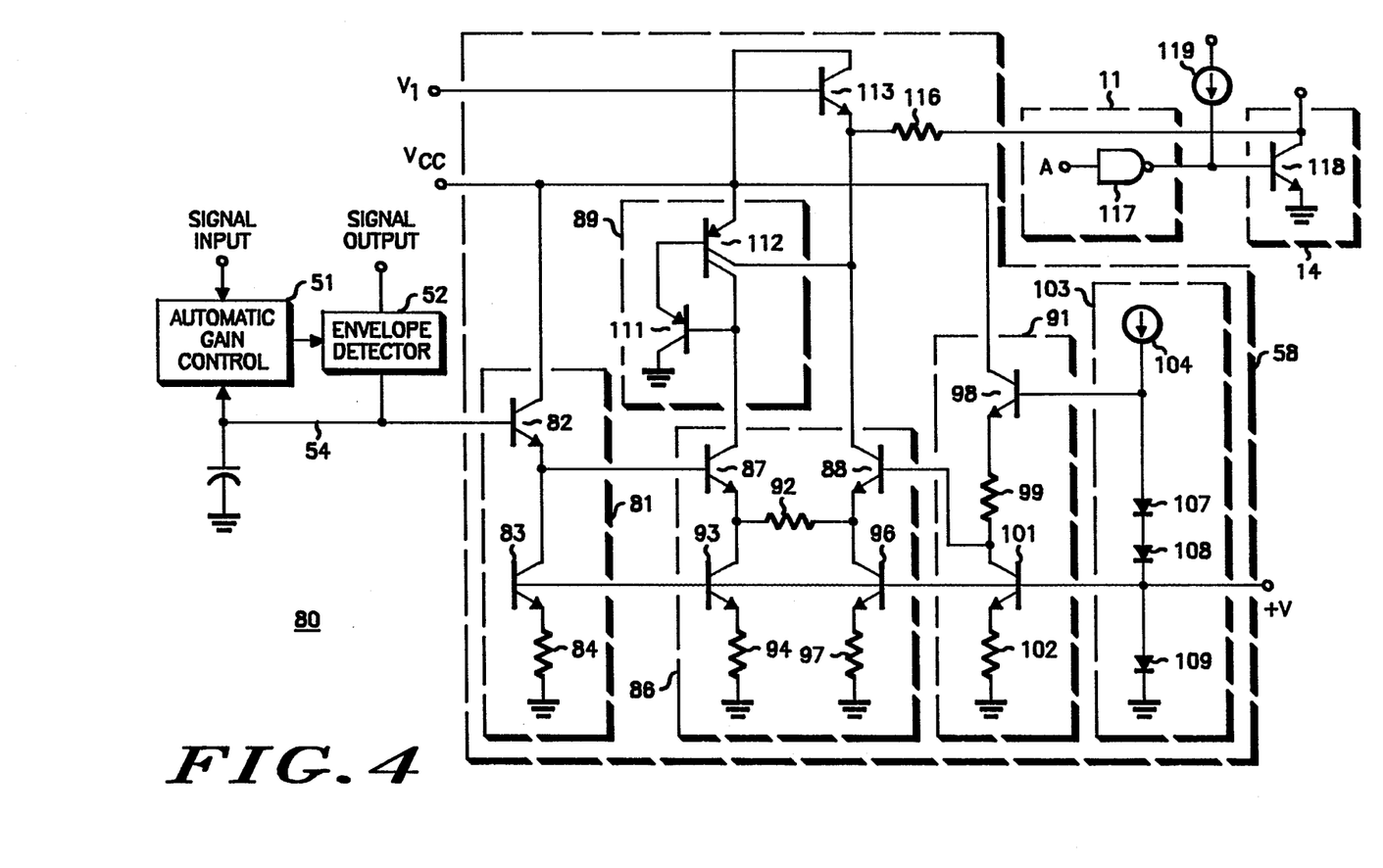
FIG. 4 comprises a schematic diagram of a third embodiment of the invention.

Referring now to FIG. 4, a third embodiment of the invention can be seen as depicted by the numeral 80. This embodiment again has a signal quality evaluation unit (58) that receives a gain control feedback signal (54) from an envelope detector (52) as developed to control an AGC unit (51) in a radio receiver. This signal passes through a first buffer (81) that includes a first transistor (82) having its base connected to receive the gain control feedback signal (54), its collector connected to $V_{CC}$, and its emitter connected to the collector of a second transistor (83). The second transistor (83) has its base connected to a positive voltage source and its emitter connected to a grounded 1.6k ohm resistor (84). The output of the buffer (81) comprises the emitter of the first transistor (82), and this emitter connects to a differential amplifier (86).

The differential amplifier (86) includes two transistors (87 and 88). The first transistor (87) has its base connected to receive the output of the first buffer (81) and a collector connected to a current mirror (89) as described below in more detail. The base of the second transistor (88) connects to a second buffer (91) as described in more detail below, and its collector connects to the current mirror (89) briefly referred to above. The emitters of both transistors are connected together by a 20k ohm resistor (92). In addition, the emitter of the first transistor (87) connects to a current source transistor (93) having its emitter connected to a grounded 1.6k ohm resistor (94). Similarly, the emitter of the second transistor (88) connects to another current source comprised of a transistor (96) having its emitter connected to a grounded 1.6 k ohm resistor (97).

The second buffer (91) referred to briefly above includes a first transistor (98) having its collector connected to $V_{CC}$ and its emitter connected through an 18k ohm offset resistor (99) to the base of the second differential amplifier transistor (88) and to a current source comprised of another transistor (101) having its emitter connected to a grounded 1.6k ohm resistor (102). The base of the buffer transistor (98) connects to a voltage bias circuit (103).

The voltage bias circuit (103) includes a current source (104) that connects to the buffer transistor (98) and three diodes (107, 108, and 109). The voltage bias circuit (103) functions to provide a dynamically stable reference for the differential amplifier (86) to use in comparing against the incoming gain control feedback signal (54).

The current mirror (89) referred to above includes a first transistor (111) having its base connected to the collector of the first differential amplifier transistor (87) and to one collector of a second current mirror transistor (112), its emitter connected to the base of the second current mirror transistor (112), and its collector connected to ground. The second current mirror transistor (112) has a second collector connected to the current mirror output and an emitter connected to $V_{CC}$.

The current mirror output connects to the emitter of a switchable clamp transistor (113), the base of which connects to a positive voltage source $V_1$ (or, in the alternative, to a switchable voltage source to effectuate control purposes of the designer). The collector of this transistor (113) connects to $V_{CC}$. In addition, the emitter of this transistor (113) connects through a 20 k ohm resistor (116) to the driver output unit (14).

The comparator (11) in this embodiment (80) can be comprised of the differential amplifier comparator (11) disclosed in FIG. 3, with the output node denoted by the reference character A connecting where indicated to the input of a I²L logic gate (117) (FIG. 4). The output of this gate (117) connects to the base of the transistor (118) that comprises the driver output unit (14). This transistor (118) has a base that also connects to a 10 microamp current source (119), an emitter that connects to ground, and a collector that provides the output signal that carries the trigger signal.

So configured, the invention will again function to provide a trigger signal whenever the comparator (11) detects that the in phase multiplier output signal includes a negative polarity component that exceeds a predetermined threshold. In addition, however, presuming that such a negative component is not detected, the output of the detection unit will comprise an analog signal the value of which reflects the value of the gain control feedback signal (54) provided to the AGC unit (51). This signal provides an analog indication of the relative strength of the incoming signal. This information can be used by a radio designer to match the performance of the radio in question to the relative strength of the stations being scanned to ensure that only stations having an appropriate threshold quality are chosen by the scanning mechanism of choice for use by the radio.

Figure 5:
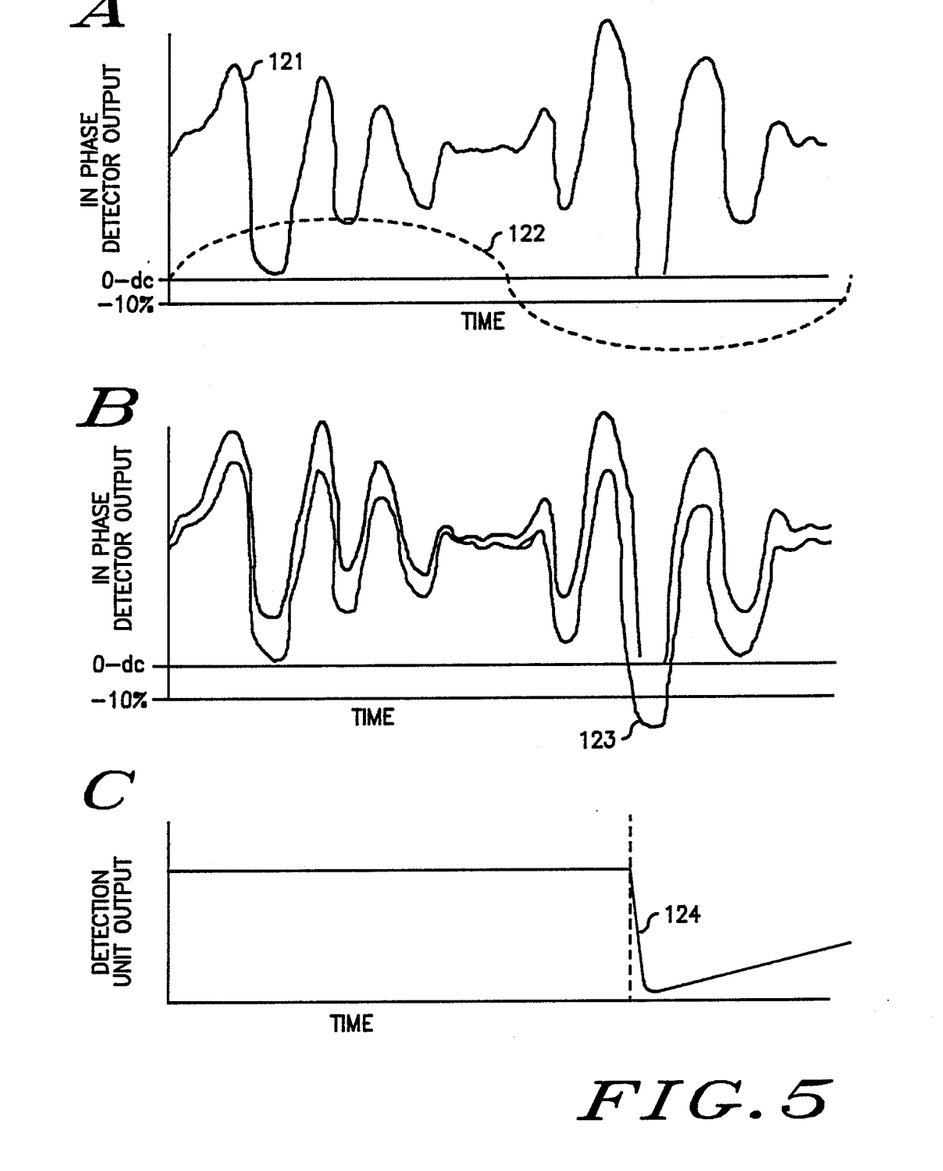
FIG. 5 shows waveform diagrams depicting typical operation of the invention.

FIGS. 5a–c depicts waveforms that help illustrate operation of the comparator function in the detection unit. In FIG. 5a an in phase multiplier output can be seen as depicted by the reference numeral 121. This signal (121) represents energy appearing on a frequency of interest. If no other signal components were present, the signal (121) would include only positive polarity components and would therefore be accepted by the detection unit for use by the radio.

Presuming that the signal (121) in question does not represent a viable broadcast signal, a 10 Hz beat note (122), for example, may be present. When summed with the previous signal (121), the beat note input will yield the waveform of FIG. 5b, which can be seen to include a negative polarity component (123) that exceeds a 10% threshold value referred to above. Upon detecting this negative polarity event, the detection unit would respond by providing a low output as a trigger signal as depicted in FIG. 5c by the reference numeral 124. This trigger signal (124) can be utilized by an appropriate scanning mechanism as well understood in the art to cause the scanning mechanism to abandon an attempt to confirm a viable broadcast signal at the frequency in question and to move on to the next signal.

Figure 6:
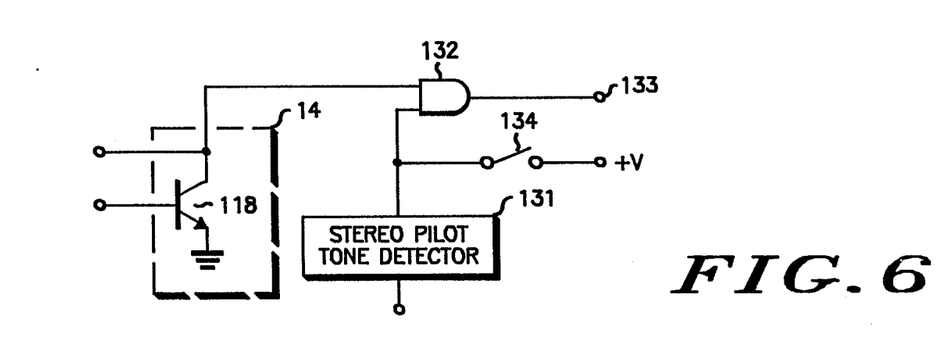
FIG. 6 comprises a schematic representation of a scan-for-stereo embodiment of the invention.

Referring now to FIG. 6, the third embodiment driver output unit (14) can be seen as configured with a stereo pilot tone detector (131) and an AND gate (132). The stereo pilot tone detector (131) may, for instance, be of the type found in many AM stereo radios. Such a detector (131) functions to sense the 25 Hz pilot tone that is broadcast with an AM stereo signal. When the pilot tone is detected, the detector (131) provides a signal that typically ignites a "stereo" indicator lamp and that enables the stereo matrix circuitry.

In the embodiment depicted in FIG. 6, this detector output is also provided to one input of an AND gate (132), the remaining input of which connects to the output of the driver output unit (14). So configured, the output (133) of the AND gate (132) will only allow a channel scanning device to stop on a selected channel if: (1) there are no negative polarity signal components in excess of a predetermined value on that channel; (2) the signal has sufficient strength; and (3) the channel in question hosts a stereo broadcast.

Such a scan-for-stereo feature could be made optional through inclusion of an operator accessible switch (134). With this switch (134) open, the system will operate as a scan-for-stereo device as described above. With this switch (134) closed, the system will operate as a channel scanning device as described earlier, and will accept either stereo or monaural broadcasts.

Those skilled in the art will recognize that various modifications could be made with respect to the above described embodiments to suit a particular application without departing from the spirit of the invention. It should therefore be understood that the claims are not to be considered as being limited to the precise embodiment set forth in the absence of specific limitations directed to such embodiments.

I claim:

1. In a radio having means for discretely receiving viable broadcast signals at a plurality of different frequencies and for locking onto one of said signals at a specific frequency to provide an output signal related to said signal, wherein:

said output signal will typically include both negative and positive polarity components when said radio has not locked onto one of said viable broadcast signals; and said output signal will typically include only constant polarity components when said radio has locked onto one of said viable broadcast signals;

a broadcast channel indication system comprising detection means for providing a trigger signal whenever said output signal has a polarity component opposite in polarity from said constant polarity.

2. In a radio having means for discretely receiving viable broadcast signals at a plurality of different frequencies and for locking onto one of said signals at a specific frequency to provide an output signal related to said signal, wherein:

said output signal will typically include both negative and positive polarity components when said radio has not locked onto one of said viable broadcast signals; and said output signal will typically include only substantially constant polarity components when said radio has locked onto one of said viable broadcast signals;

a broadcast channel indication system comprising detection means for providing a trigger signal whenever said output signal has a polarity component opposite in polarity from said constant polarity and said output signal has a value that exceeds a predetermined threshold.

3. The broadcast channel indication system of claim 2 wherein said predetermined threshold at least equals 10% of maximum value of said constant polarity component.

4. In a radio having means for discretely receiving viable broadcast signals at a plurality of different frequencies and means for locking onto one of said signals at a specific frequency to provide an output signal related to said signal, said locking means including an in phase multiplier having an output that provides an output signal that will typically include both negative and positive polarity components when said radio has not locked onto one of said viable broadcast signals and that will typically include only constant polarity components when said radio has locked onto one of said viable broadcast signals, an improvement comprising detection means for receiving said output signal and for providing a trigger signal whenever said output signal both has a polarity component opposite in polarity from said constant polarity and a value that exceeds a predetermined threshold.

5. The improvement of claim 4 and further including pulse generator means for responding to said trigger signal by providing a shaped pulse.

6. The improvement of claim 5 and further including latch means for receiving said shaped pulse and for providing a latch output signal having at least a predetermined period.

7. The improvement of claim 6 and further including driver output means for receiving said latch output signal and for providing a drive signal that may be used to appropriately trigger a channel scanning mechanism.

8. The improvement of claim 4 wherein said detection means comprises a differential amplifier.

9. The improvement of claim 4 wherein said predetermined threshold at least equals 10% of maximum value of said constant polarity component.

10. In a radio having means for discretely receiving signals at a plurality of different frequencies and for providing an output signal related to at least one of said signals, wherein:

said output signal will typically include both negative and positive polarity components when said radio is not receiving one of said viable broadcast signals; and said output signal will typically include only constant polarity components when said radio is receiving one of said viable broadcast signals;

a broadcast channel indication system comprising:

(a) detection means for providing a trigger signal whenever said output signal has a polarity component opposite in polarity from said constant polarity; and (b) signal quality evaluation means for responding to said output signal by providing said trigger signal when said output signal does not exhibit signal strength that at least equals a predetermined threshold; such that said trigger signal can be used by a channel scanning mechanism to operate or inhibit a scanning function.

* * * * *